US011984411B2

(12) United States Patent
Wu

(10) Patent No.: US 11,984,411 B2
(45) Date of Patent: May 14, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Tong Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 355 days.

(21) Appl. No.: 17/456,638

(22) Filed: Nov. 28, 2021

(65) Prior Publication Data

US 2022/0223547 A1 Jul. 14, 2022

Related U.S. Application Data

(63) Continuation of application No. PCT/CN2021/107613, filed on Jul. 21, 2021.

(30) Foreign Application Priority Data

Jan. 14, 2021 (CN) ......................... 202110050743.X

(51) Int. Cl.
*H01L 23/64* (2006.01)
*H01L 49/02* (2006.01)

(52) U.S. Cl.
CPC ............ *H01L 23/645* (2013.01); *H01L 28/10* (2013.01)

(58) Field of Classification Search
CPC ............................ H01L 23/645; H01L 28/10
See application file for complete search history.

(56) References Cited

U.S. PATENT DOCUMENTS

| 7,119,650 | B2 * | 10/2006 | Gardner | H01L 23/645 |
| | | | | 336/200 |
| 8,072,042 | B1 * | 12/2011 | Kroener | H01L 28/10 |
| | | | | 257/E21.022 |
| 9,514,881 | B2 | 12/2016 | Hong et al. | |
| 11,476,043 | B2 * | 10/2022 | Syed Mohammed | H01F 27/32 |
| 2015/0042440 | A1 * | 2/2015 | Tsurumi | H01F 27/2804 |
| | | | | 336/221 |
| 2017/0373133 | A1 * | 12/2017 | Liao | H01L 28/10 |

(Continued)

FOREIGN PATENT DOCUMENTS

| CN | 101740195 A | 6/2010 |
| CN | 102479685 A | 5/2012 |
| CN | 103474415 A | 12/2013 |

(Continued)

OTHER PUBLICATIONS

International Search Report (ISR) in international application No. PCT/CN2021/107613 dated Oct. 20, 2021.

(Continued)

*Primary Examiner* — Omar F Mojaddedi
(74) *Attorney, Agent, or Firm* — Syncoda LLC; Feng Ma

(57) ABSTRACT

A semiconductor structure includes a substrate and a medium layer located on a first face of the substrate, the substrate has a plurality of first metal layers therein, the medium layer has a magnetic core therein, an orthographic projection of the magnetic core on the first face has a closed ring pattern, the first metal layer has a first end and a second end opposite to each other, an orthographic projection of the first end on the first face is located within a region surrounded by the closed ring pattern.

17 Claims, 9 Drawing Sheets

(56) References Cited

U.S. PATENT DOCUMENTS

2019/0272936 A1\* 9/2019 Zhang ................... H01L 28/10
2019/0333875 A1\* 10/2019 Liao .................... H01L 23/645

FOREIGN PATENT DOCUMENTS

| CN | 105679488 A | 6/2016 |
|---|---|---|
| CN | 106340508 A | 1/2017 |
| CN | 108807300 A | 11/2018 |
| CN | 112864135 A | 5/2021 |
| CN | 112864136 A | 5/2021 |

OTHER PUBLICATIONS

CN first office action in Application No. 202110050743.X, dated May 10, 2022.
CN first office action in Application No. 202110049102.2, dated Jan. 12, 2022.
International Search Report (ISR) in Application No. PCT/CN2021/109964, dated Nov. 3, 2021.

\* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2021/107613 filed on Jul. 21, 2021, which claims priority to Chinese Patent Application No. 202110050743.X filed on Jan. 14, 2021. The disclosures of the above-referenced applications are hereby incorporated by reference in their entirety.

BACKGROUND

Inductors are a fundamental component of electronic products. Micro-inductors are widely applied in radio frequency micro-electromechanical systems and micro-actuators, and can function as an energy storage element for Switch Mode Power Supplies (SMPS). The development of next-generation power supplies has focused mainly on the miniaturization of the SMPS, i.e., Power Supply in Package (PwrSiP) and Power Supply on Chip (PwrSoC). Among these power supplies, the PwrSoC is developed to integrate all power electronic components to a chip, in order to achieve higher degree of integration, low cost, and high efficiency and power density. The PwrSoC technologies require compact physical size, high current capacity and high quality factors in the inductors.

SUMMARY

Embodiments of the present disclosure relate to the field of semiconductors, and in particular, to a semiconductor structure and a manufacturing method thereof.

The embodiments of the present disclosure provide a semiconductor structure and a manufacturing method thereof, facilitating an improvement in the electrical performances of an inductor and a reduction in the space occupied by the inductor in a semiconductor structure.

The embodiments of the present disclosure provide a semiconductor structure, which includes: a substrate and a medium layer located on a first face of the substrate, the substrate having a plurality of first metal layers therein, the medium layer having a magnetic core therein, an orthographic projection of the magnetic core on the first face having a closed ring pattern, an orthographic projection of each of the first metal layers on the first face intersecting with the orthographic projection of the magnetic core on the first face, the first metal layer having a first end and a second end opposite to each other, an orthographic projection of the first end on the first face being located within a region surrounded by the closed ring pattern, and an orthographic projection of the second end on the first face being located outside of the region surrounded by the closed ring pattern; and a plurality of second metal layers, the second metal layers being located in the medium layer, the second metal layers being located on a side of the magnetic core away from the substrate and also on the two opposite sides of the magnetic core, one end of the second metal layer being electrically connected with the first end of one of the first metal layers, the other end of the second metal layer being electrically connected with the second end of another one of the first metal layers, the plurality of first metal layers and the plurality of second metal layers constituting a solenoid-shaped metal layer, and the metal layer and the magnetic core having a gap therebetween.

The embodiments of the present disclosure also provide a manufacturing method of the semiconductor structure, which includes: providing a substrate, the substrate having a plurality of first metal layers therein; forming a medium layer on a first face of the substrate, the medium layer having a magnetic core therein, an orthographic projection of the magnetic core on the first face having a closed ring pattern, an orthographic projection of each of the first metal layers on the first face intersecting with the orthographic projection of the magnetic core on the first face, the first metal layer having a first end and a second end opposite to each other, an orthographic projection of the first end on the first face being located within a region surrounded by the closed ring pattern, and an orthographic projection of the second end on the first face being located outside of the region surrounded by the closed ring pattern; etching the medium layer to form through holes, the through holes being located on the two opposite sides of the magnetic core and being exposed out of the first end or the second end; and forming a plurality of second metal layers, the second metal layers filling up the through holes and also being located on a side of the magnetic core away from the substrate, one end of the second metal layer being electrically connected with the first end of one of the first metal layers, the other end of the second metal layer being electrically connected with the second end of another one of the first metal layers, the plurality of first metal layers and the plurality of second metal layers constituting a solenoid-shaped metal layer, and the metal layer and the magnetic core having a gap therebetween.

BRIEF DESCRIPTION OF THE DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DETAILED DESCRIPTION

Figure 1:
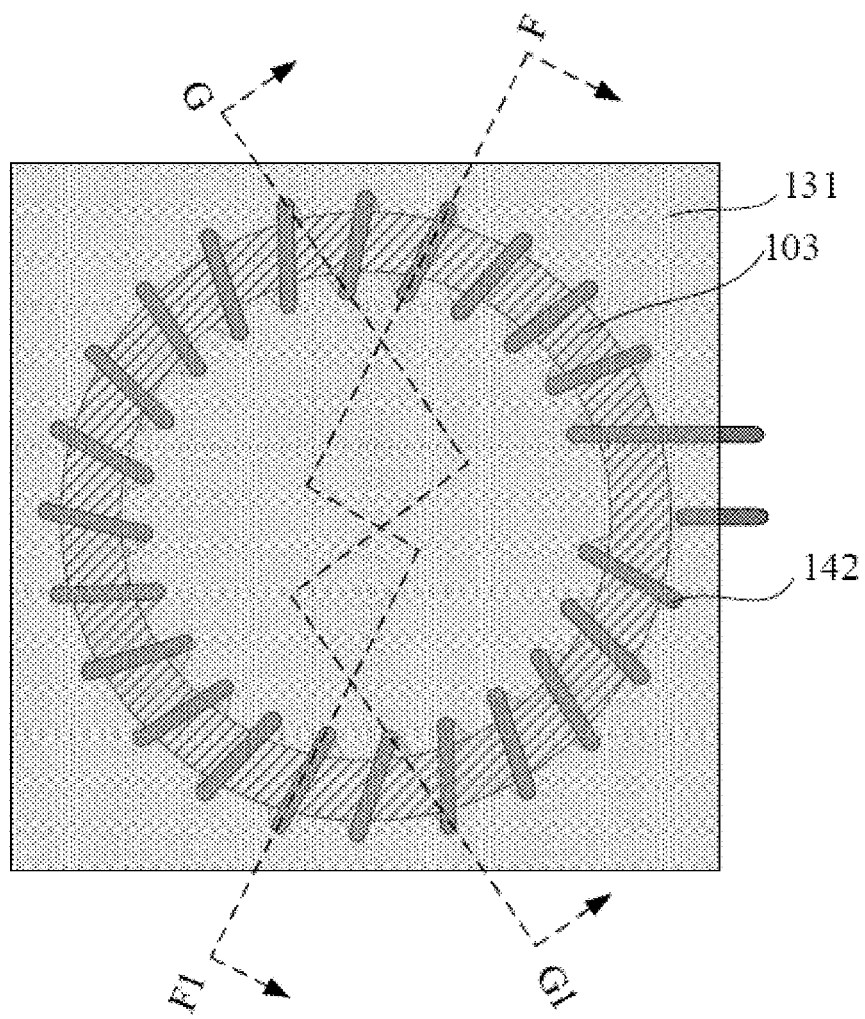
FIG. 1 is a schematic structural top-view diagram of a semiconductor structure according to a first embodiment of the present disclosure.

With the continuous development of semiconductor technologies, the size of chips shrinks, and there exists higher requirements for the size and electrical performances of the inductors integrated on the chips.

According to analysis, inductors are a fundamental power electronic component.

In the preparation process of PwrSoC, in order to achieve a higher degree of integration by integrating more power electronic components to the same chip, the physical size of the inductor needs to be made more compact while at the same time ensuring good operating performances of the inductor. At present, the inductor used in a semiconductor structure is typically a planar inductor, i.e., the inductor made by winding a metal layer on the surface of a substrate or a medium layer. To improve the electrical performances of the inductor, it is generally necessary to use a highly-conductive metal layer with higher material costs or increase the thickness of the metal layer so as to reduce the resistance in the inductor. This is not conducive to lowering the manufacturing cost of the semiconductor structure and reducing the space occupied by the inductor in the semiconductor structure.

The embodiments of the present disclosure provide a semiconductor structure, wherein a substrate has a plurality of first metal layers therein, a medium layer has a magnetic core and a plurality of second metal layers therein, the medium layer is located on a first face of the substrate, the second metal layers are located on a side of the magnetic core away from the substrate and on the two opposite sides of the magnetic core, an orthographic projection of the magnetic core on the first face has a closed ring pattern, the first metal layers and the second metal layers collectively constitute a solenoid-shaped metal layer wound around the magnetic core, and the metal layer and the magnetic core collectively constitute a stereoscopic solenoid inductor in the semiconductor structure. By doing so, the orthographic projection area of the solenoid inductor on the surface of the substrate can be reduced and thus, compact physical size of the solenoid inductor can be realized. In addition, winding the metal layer on the magnetic core is favorable for enhancing the quality factors of the solenoid inductor, further improving the electrical performances and operating efficiency of the solenoid inductor.

In order to make the objectives, the technical solutions, and the advantages of the embodiments of the present disclosure clearer, the detailed description of the embodiments of the present disclosure is given below in combination with the accompanying drawings. However, the ordinary skills in the art can understand that many technical details are provided in the embodiments of the present disclosure so as to make the readers better understand the present disclosure. However, even if these technical details are not provided and based on a variety of variations and modifications of the following embodiments, the technical solutions sought for protection in the present disclosure can also be realized.

Figure 2:
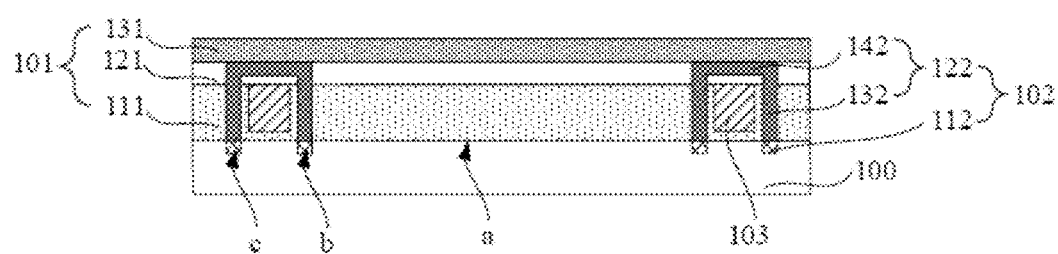
FIG. 2 is a schematic structural sectional diagram of FIG. 1 along an FF1 direction.
Figure 3:
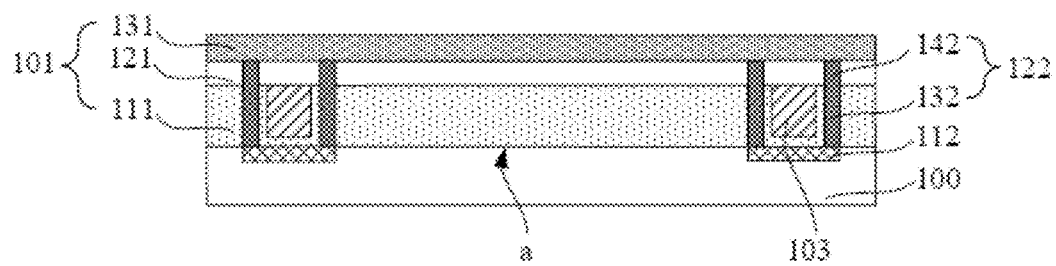
FIG. 3 is a schematic structural sectional diagram of FIG. 1 along a GG1 direction.
Figure 4:
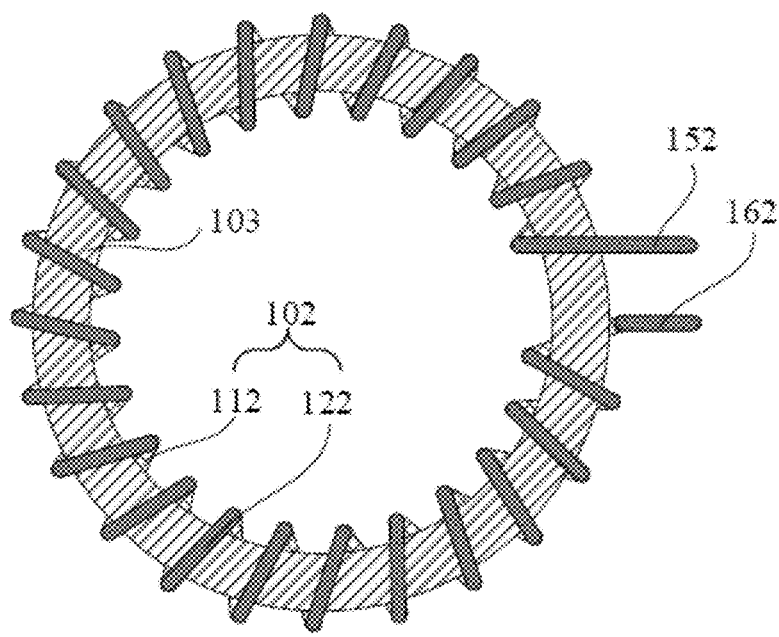
FIG. 4 is a schematic structural top-view diagram of a combined structure consisting of a first metal layer, a second metal layer and a magnetic core, in a first embodiment of the present disclosure.

FIG. 1 is a schematic structural top-view diagram of the semiconductor structure according to a first embodiment of the present disclosure; FIG. 2 is a schematic structural sectional diagram of FIG. 1 along an FF1 direction; FIG. 3 is a schematic structural sectional diagram of FIG. 1 along a GG1 direction; and FIG. 4 is a schematic structural top-view diagram of a combined structure consisting of the first metal layer, the second metal layer and the magnetic core.

With reference to FIG. 1 to FIG. 4, the semiconductor structure includes: a substrate 100 and a medium layer 101 located on a first face a of the substrate 100, wherein the substrate 100 has a plurality of first metal layers 112 therein, the medium layer 101 has a magnetic core 103 therein, an orthographic projection of the magnetic core 103 on the first face a has a closed ring pattern, an orthographic projection of each of the first metal layers 112 on the first face a intersects with the orthographic projection of the magnetic core 103 on the first face a, the first metal layer 112 has a first end b and a second end c opposite to each other, an orthographic projection of the first end b on the first face a is located within a region surrounded by the closed ring pattern, and an orthographic projection of the second end c on the first face a is located outside of the region surrounded by the closed ring pattern; and a plurality of second metal layers 122, wherein the second metal layers 122 are located in the medium layer 101, the second metal layers 122 are located on a side of the magnetic core 103 away from the substrate 100 and also on the two opposite sides of the magnetic core 103.

With combined reference to FIG. 1 and FIG. 2, one end of the second metal layer 122 is electrically connected with the first end b of one of the first metal layers 112, the other end of the second metal layer 122 is electrically connected with the second end c of another one of the first metal layers 112, the plurality of first metal layers 112 and the plurality of second metal layers 122 constitute a solenoid-shaped metal layer 102, and the metal layer 102 and the magnetic core 103 has a gap therebetween. Further, the metal layer 102 and the magnetic core 103 have the medium layer 101 therebetween. In particular, the first metal layer 112 and the magnetic core 103 have a first medium layer 111 therebetween, and the second metal layer 122 and the magnetic core 103 have a second medium layer 121 therebetween.

In this embodiment, the first metal layers 112 and the second metal layers 122 collectively constitute the solenoid-shaped metal layer 102 wound surround the magnetic core 103, and the metal layer 102 and the magnetic core 103 collectively constitute a stereoscopic solenoid inductor in the semiconductor structure. By doing so, the orthographic projection area of the solenoid inductor on the substrate 100 can be reduced and thus, compact physical size of the solenoid inductor can be realized. In addition, winding the metal layer 102 on the magnetic core 103 is favorable for enhancing the quality factors of the solenoid inductor, further improving the electrical performances and operating efficiency of the solenoid inductor.

In particular, the orthographic projection of the magnetic core 103 on the first face a has a closed ring pattern, and in other embodiments, the orthographic projection of the magnetic core on the first face may also be a closed elliptical ring pattern or a closed square ring pattern. The material of the magnetic core 103 may be high-permeability materials such as iron-nickel alloy, iron-nickel-zinc alloy, or iron-nickel-molybdenum alloy. This helps to further increase the inductance of the solenoid inductor, thereby further improving the quality factors of the solenoid inductor.

The materials of the substrate 100 and the medium layer 101 may be at least one of silicon-containing materials such as silicon, silicon germanium, silicon oxide, silicon nitride, silicon oxynitride, silicon carbide, silicon carbonitride, or silicon oxycarbide. In an example, the material of the substrate 100 is silicon and the material of the medium layer 101 is silicon oxide. This facilitates improving the compatibility between the process for formation of the solenoid inductor and the semiconductor manufacturing process that is commonly used.

The materials of the first metal layer 112 and the second metal layer 122 may be at least one of metal materials such as copper, silver, tungsten, titanium, gold, nickel, or palladium. In an example, the materials of both the first metal layer 112 and the second metal layer 122 may be copper. Since copper is low in cost and good in conductivity, excessively high preparation cost of the first metal layer 112 and the second metal layer 122 can be avoided while reducing the resistances of the first metal layer 112 and the second metal layer 122. As a result, it is beneficial to further increase the inductance of the solenoid inductor and avoid the excessively high preparation cost of the solenoid inductor. In other embodiments, the materials of the first metal layer and the second metal layer may be different.

With continued reference to FIG. 1, the second metal layer 122 includes third metal layers 132 located on the two opposite sides of the magnetic core 103 and a fourth metal layer 142 located on a side of the magnetic core 103 away from the substrate 100. The third metal layer 132 penetrates through a part of the medium layer 101 and is electrically connected with the first metal layer 112.

In this embodiment, the third metal layer 132 and the fourth metal layer 142 are structurally integrally formed. The materials of both the third metal layer 132 and the fourth metal layer 142 are copper, which is favorable for the overall conductivity of the third metal layer 132 and the fourth metal layer 142 and further for improving the quality factors of the solenoid inductor. In other embodiments, the third metal layer and the fourth metal layer may have a layered structure, and the materials of the third metal layer and the fourth metal layer may be different as well. Further, one of the third metal layer and the fourth metal layer is made of a material with good conductivity and low cost, whereas the other is made of a material with better conductivity and yet higher cost. By doing so, the conductivity of the second metal layer can be further improved, while at the same time ensuring that the overall material cost of the second metal layer is relatively low.

In this embodiment, with combined reference to FIG. 2 to FIG. 4, the first metal layer 112, the third metal layer 132 and the fourth metal layer 142 are all elongated. In a direction perpendicular to an extension direction of the first metal layer 112, the width of the first metal layer 112 is a first width, and in the extension direction of the first metal layer 112, the length of the first metal layer 112 is a first length. In a direction perpendicular to an extension direction of the third metal layer 132, the width of the third metal layer 132 is a second width. The distance between two third metal layers 132 connected with the same first metal layer 112 is a second length. The first width is equal to the second width and the first length is equal to the second length. In other embodiments, the first width may be greater than the second width and the first length is greater than the second length, i.e., in the second metal layer, the orthographic projection of the third metal layer close to the first metal layer, on the first face a, falls completely into the orthographic projection of the first metal layer on the first face a. Then, when the second metal layer is formed, it can be ensured, within certain process errors, that the bottom faces of the second metal layers close to the substrate are all electrically connected with the first metal layer, and further that the contact area between the second metal layer and the first metal layer is large enough to guarantee excellent conductivity between the second metal layer and the first metal layer.

In particular, in a direction perpendicular to the first face a, the first metal layer 112 has a thickness ranging from 50 nm to 400 nm. In an example, the thickness of the first metal layer 112 is 100 nm and thus the first metal layer 112 has a relatively small resistance value. This facilitates reducing the space in the semiconductor structure occupied by the solenoid inductor, while at the same time ensuring that there are high quality factors in the solenoid inductor. Therefore, the space utilization of the semiconductor structure can be improved and more power electronic components with compact sizes can be integrated to the same chip.

In this embodiment, in the direction perpendicular to the first face a, the range of the thickness of the fourth metal layer 142 is the same as the range of the thickness of the first metal layer 112; and the range of the thickness of the third metal layer 132 in the direction perpendicular to the extension direction of the third metal layer 132 is the same as the range of the thickness of the first metal layer 112. In an example, the thicknesses of both the third metal layer 132 and the fourth metal layer 142 are the same as the thickness of the first metal layer 112, i.e., 100 nm, and then both the third metal layer 132 and the fourth metal layer 142 have relatively small resistance values. Likewise, this facilitates reducing the space in the semiconductor structure occupied by the solenoid inductor, while at the same time ensuring that there are high quality factors in the solenoid inductor. Therefore, the space utilization of the semiconductor structure can be improved.

In particular, the spacing between the first metal layer 112 and the magnetic core 103 is not less than 20 nm. In an example, the spacing between the first metal layer 112 and the magnetic core 103 is 25 nm. This facilitates decreasing the parasitic capacitance between the first metal layer 112 and the magnetic core 103, and further improving the filtering effect and operating efficiency of the solenoid inductor.

In this embodiment, the range of the spacing between the third metal layer 132 and the magnetic core 103 is the same as the range of the spacing between the first metal layer 112 and the magnetic core 103, and the range of the spacing between the fourth metal layer 142 and the magnetic core 103 is the same as the range of the spacing between the first metal layer 112 and the magnetic core 103 as well. In an example, both the spacing between the third metal layer 132 and the magnetic core 103 and the spacing between the fourth metal layer 142 and the magnetic core 103 are the same as the spacing between the first metal layer 112 and the magnetic core 103, i.e., 25 nm. This facilitates decreasing the parasitic capacitance between the third metal layer 132 and the magnetic core 103 and the parasitic capacitance between the fourth metal layer 142 and the magnetic core 103, and further improving the filtering effect and operating efficiency of the solenoid inductor.

In particular, the spacing between the adjacent first metal layers 112 is not less than 10 nm. In an example, the spacing between the adjacent first metal layers 112 is 15 nm. This facilitates decreasing the parasitic capacitance between the adjacent first metal layers 112, and further improving the filtering effect and operating efficiency of the solenoid inductor.

Further, with continued reference to FIG. 1, the medium layer 101 at least includes a first medium layer 111 located on the first face a and a second medium layer 121 located on a side of the first medium layer 111 away from the substrate 100. The magnetic core 103 is located in the first medium layer 111, the third metal layer 131 penetrates through the first medium layer 111 and the second medium layer 121, and the fourth metal layer 142 is located in the second medium layer 121. Further, the third metal layer 131 and the magnetic core 103 have the first medium layer 111 therebetween, and the fourth metal layer 142 and the magnetic core 103 have the second medium layer 121 therebetween.

In this embodiment, the materials of the first medium layer 111 and the second medium layer 121 are the same, i.e., silicon dioxide. In other embodiments, the first medium layer and the second medium layer may also be made of a different silicon-containing material.

Further, the medium layer 101 further includes a third medium layer 131 located on a side of the second medium layer 121 away from the substrate 100, and the third medium layer 131 is also located on the surface of the fourth metal layer 142, such that the fourth metal layer 142 is protected by the third medium layer 131 to avoid interferences between the fourth metal layer 142 and other power electronic components subsequently formed on the second medium layer 121.

In this embodiment, the semiconductor structure may further include a first lead 152 and a second lead 162. The first lead 152 is electrically connected with one end of the metal layer 102, the second lead 162 is electrically connected with the other end of the metal layer 102, and the first lead 152 and the second lead 162 are structurally integrally formed with the second metal layer 102, which is to say, the first lead 152, the second lead 162 and the second metal layer 102 can be collectively prepared by integral forming, thereby avoiding generation of a contact resistance between the first lead 152 and the second lead 162 and the second metal layer 102, and further facilitating an improvement in the conductivity between the first lead 152 and the second lead 162 and the second metal layer 102. In particular, with reference to FIG. 1 and FIG. 2, the first lead 152 is electrically connected with one fourth metal layer 142, and the second lead 152 is electrically connected with one third metal layer 132. In other embodiments, the first lead and the second lead may not be structurally integrally formed with the metal layer, the first lead may be electrically connected with the third metal layer or the first metal layer, and the second lead may be electrically connected with the fourth metal layer or the first metal layer.

In conclusion, the semiconductor structure according to the first embodiment of the present disclosure has the solenoid-shaped metal layer 102 that is collectively constituted by the first metal layer 112 and the second metal layer 122 and wound around the magnetic core 103. The metal layer 102 and the magnetic core 103 collectively constitute the stereoscopic solenoid inductor in the semiconductor structure. The orthographic projection area of this solenoid inductor on the surface of the substrate is relatively small and the metal layer 102 is wound around the magnetic core 103. This facilitates improving the permeability of the solenoid inductor, and further helps to realize compact physical size of the solenoid inductor while improving the quality factors of the solenoid inductor, in order to reduce the space in the semiconductor structure that is occupied by the solenoid inductor. Moreover, the substrate 100 only has the first metal layer 112 therein and thus, other power electronic components may also be integrated into the substrate 100 that corresponds to a location directly below the solenoid inductor. This helps to further improve the space utilization of the semiconductor structure.

Figure 16:
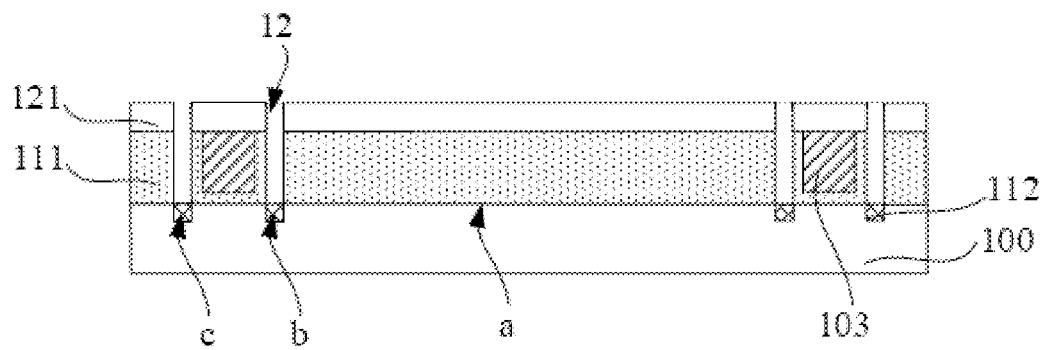
FIG. 16 is a first schematic structural sectional diagram corresponding to various steps of the manufacturing method of another second metal layer according to the second embodiment of the present disclosure.
Figure 17:
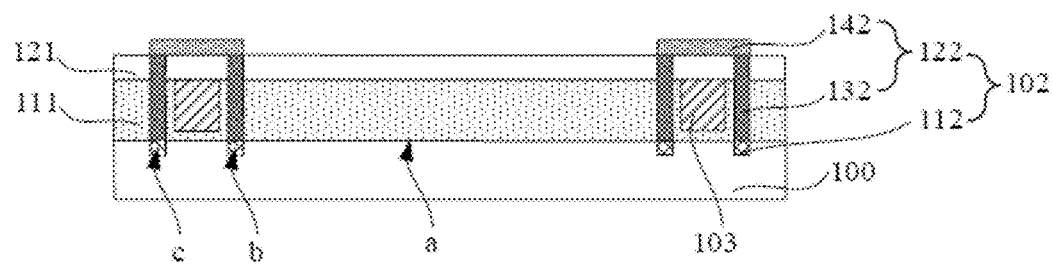
FIG. 17 is a second schematic structural sectional diagram corresponding to various steps of the manufacturing method of another second metal layer according to the second embodiment of the present disclosure.
Figure 18:
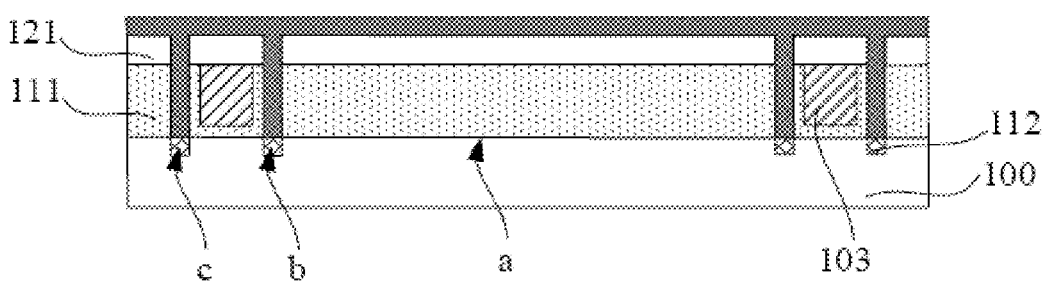
FIG. 18 is a first schematic structural sectional diagram corresponding to various steps of the manufacturing method of another second metal layer according to the second embodiment of the present disclosure.
Figure 19:
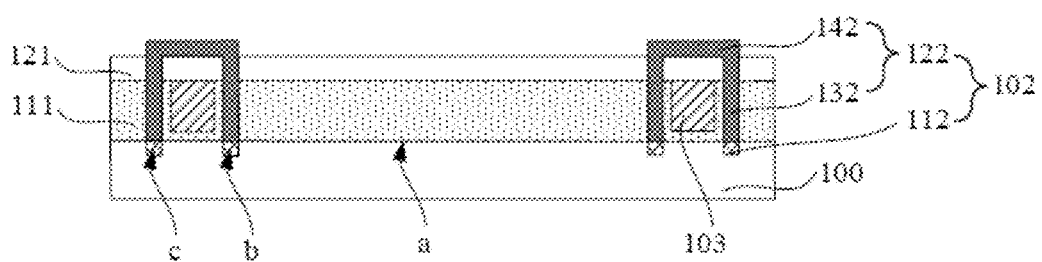
FIG. 19 is a second schematic structural sectional diagram corresponding to various steps of the manufacturing method of another second metal layer according to the second embodiment of the present disclosure.

Accordingly, the second embodiment of the present disclosure further provides a manufacturing method of the semiconductor structure, which is configured to prepare the above semiconductor structure. FIG. 5, FIG. 8, FIG. 10, FIG. 12 and FIG. 14 are schematic structural top-view diagrams corresponding to various steps of the manufacturing method of the semiconductor structure according to the second embodiment of the present disclosure; FIG. 6, FIG. 7, FIG. 9, FIG. 11, FIG. 13 and FIG. 15 are schematic structural sectional diagrams corresponding to various steps of the manufacturing method of the semiconductor structure according to the second embodiment of the present disclosure; FIG. 16 and FIG. 17 are schematic structural sectional diagrams corresponding to various steps of the manufacturing method of another second metal layer according to the second embodiment of the present disclosure; and FIG. 18 and FIG. 19 are schematic structural sectional diagrams corresponding to various steps of the manufacturing method of another second metal layer according to the second embodiment of the present disclosure.

Referring to FIG. 1 and FIG. 2, a substrate 100 is provided that has a plurality of first metal layers 112 therein. A medium layer 101 is formed on a first face a of the substrate 100, the medium layer 101 has a magnetic core 103 therein, an orthographic projection of the magnetic core 103 on the first face a has a closed ring pattern, an orthographic projection of each of the first metal layers 112 on the first face a intersects with the orthographic projection of the magnetic core 103 on the first face a, the first metal layer 112 has a first end b and a second end c opposite to each other, an orthographic projection of the first end b on the first face a is located within a region surrounded by the closed ring pattern, and an orthographic projection of the second end c on the first face a is located outside of the region surrounded by the closed ring pattern.

In particular, the process step of forming the plurality of first metal layers includes the followings.

Figure 5:
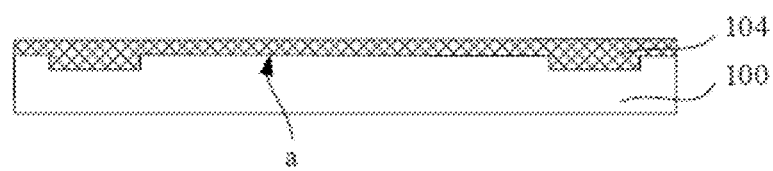
FIG. 5 is a schematic structural top-view diagram corresponding to various steps of a manufacturing method of the semiconductor structure according to a second embodiment of the present disclosure.

With reference to FIG. 5, the substrate 100 is etched to form a plurality of first grooves. In this embodiment, the method of forming the first grooves includes pattern-dry etching.

The substrate 100 is immersed in a first solution and electroplated there, to form a first basic metal layer 104 in the first grooves and on the first face a. In particular, prior to formation of the first basic metal layer 104, a first electroplating seed layer is deposited on the surfaces of the first grooves and on the first face a, so as to facilitate forming the first basic metal layer 104 in the first grooves and on the first face a during the subsequent electroplating process for the substrate 100. In addition, the first electroplating seed layer is conducive to improving the contact characteristics between the subsequently formed first metal layer and the substrate 100, and thus it is avoided that execution of the subsequent process steps is affected since the first metal layer falls off or is displaced during these subsequent process steps.

Figure 6:
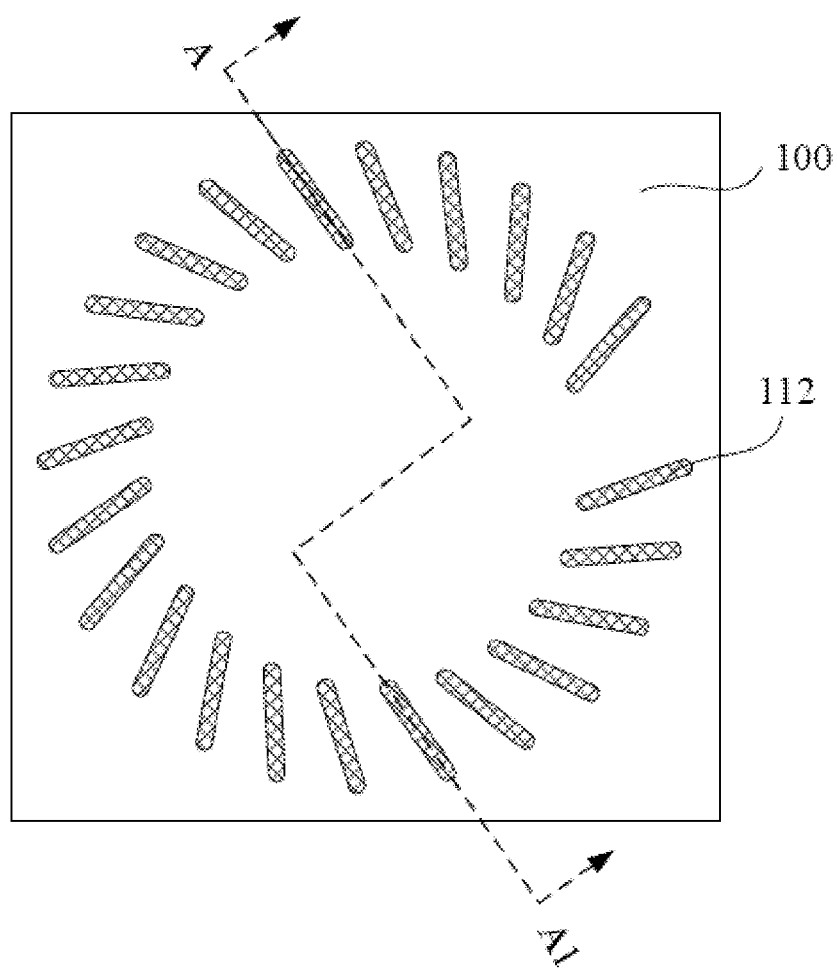
FIG. 6 is a schematic structural sectional diagram corresponding to various steps of the manufacturing method of the semiconductor structure according to the second embodiment of the present disclosure.
Figure 7:
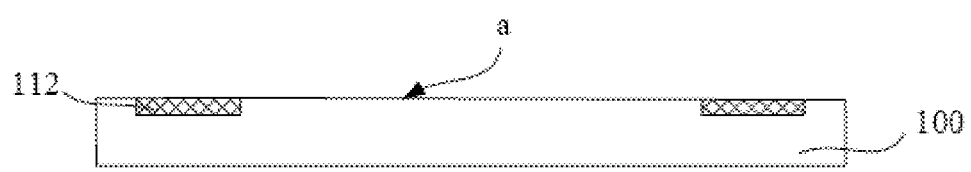
FIG. 7 is a schematic structural sectional diagram corresponding to various steps of the manufacturing method of the semiconductor structure according to the second embodiment of the present disclosure.

In this embodiment, the methods for depositing the first electroplating seed layer include physical vapor deposition (including PVD, sputtering, etc.), chemical vapor deposition or chemical plating, etc. The first solution may be copper sulfate solution, silver sulfate solution, zinc sulfate solution or the like. Referring to FIG. 6 and FIG. 7, FIG. 7 is a schematic structural stepped sectional diagram of FIG. 6 along an AA1 direction. The first basic metal layer 104 and the first electroplating seed layer are planarized until the first face a is exposed, so as to form the first metal layer 112. The methods for planarization include chemical mechanical polishing.

In other embodiments, the method for forming the first metal layer may also be as follows: initial first metal layers are formed in the first groove and on the first face using a deposition process, and are then partly etched or planarized to form the first metal layer.

In this embodiment, the first basic metal layer is formed in the first groove and on the first face a. This helps ensure that the first groove is filled up with the first basic metal layer, and further that the first metal layer 112 that is subsequently obtained after polishing fills up the first groove. By doing so, the overall resistance of the metal layer in the subsequently formed solenoid inductor can be reduced and the inductance of the solenoid inductor can thus be increased. In other embodiments, the first metal layer may also be formed in the first groove using a deposition process.

Figure 8:
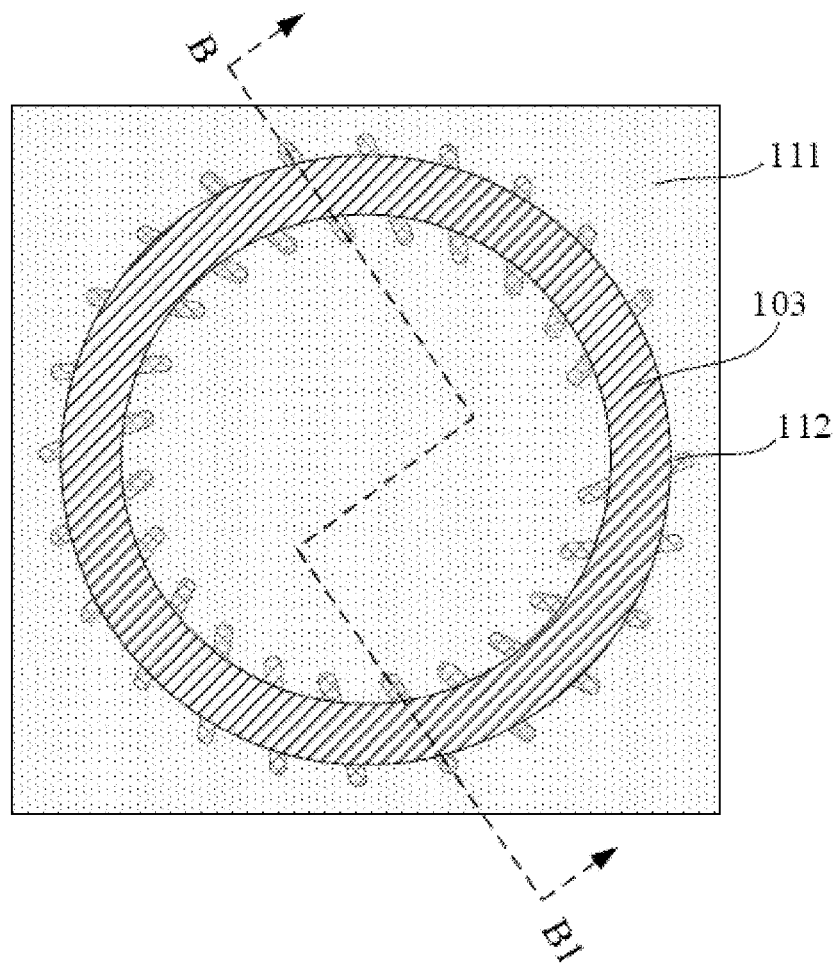
FIG. 8 is a schematic structural top-view diagram corresponding to various steps of the manufacturing method of the semiconductor structure according to the second embodiment of the present disclosure.
Figure 9:
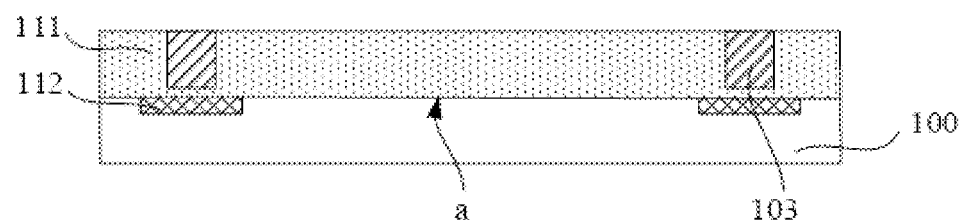
FIG. 9 is a schematic structural sectional diagram corresponding to various steps of the manufacturing method of the semiconductor structure according to the second embodiment of the present disclosure.

With continued reference to FIG. 8 and FIG. 9, FIG. 9 is a schematic structural stepped sectional diagram of FIG. 8 along a BB1 direction. The medium layer 101 (see FIG. 2) includes a first medium layer 111 located on the first face a. The process step of forming the magnetic core 103 includes the following step.

The first medium layer 111 is etched to form a trench, with the first medium layer 111 being located between the trench and the first metal layer 112. An orthographic projection of the trench on the first face a has a closed ring pattern. A metal material layer is formed that covers the first medium layer 111 and completely fills the trench. In particular, a metal material layer may be formed in the trench and on the surface of the first medium layer 111 using a deposition process.

Then, the metal material layer is planarized until the surface of the first medium layer 111 is exposed, so as to form the magnetic core 103.

In this embodiment, the methods for forming the trench include pattern-dry etching. In addition, the methods for depositing the metal material layer include physical vapor deposition (including PVD, sputtering, etc.), chemical vapor deposition or spraying, etc. The metal material layer may be high-permeability materials such as iron-nickel alloy, iron-nickel-zinc alloy, or iron-nickel-molybdenum alloy.

Figure 10:
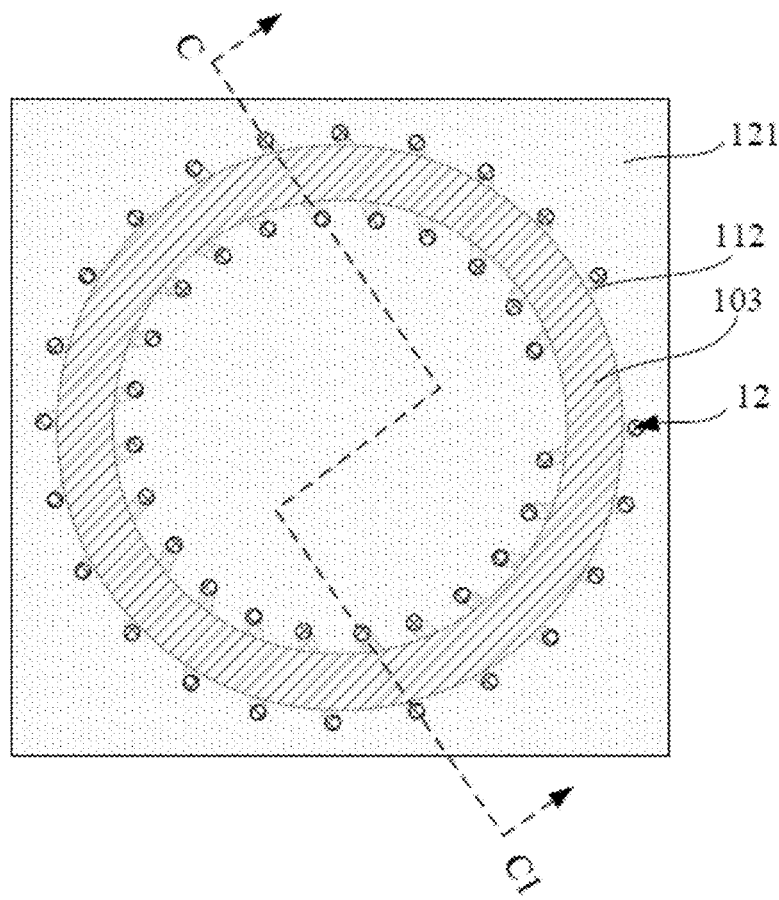
FIG. 10 is a schematic structural top-view diagram corresponding to various steps of the manufacturing method of the semiconductor structure according to the second embodiment of the present disclosure.
Figure 11:
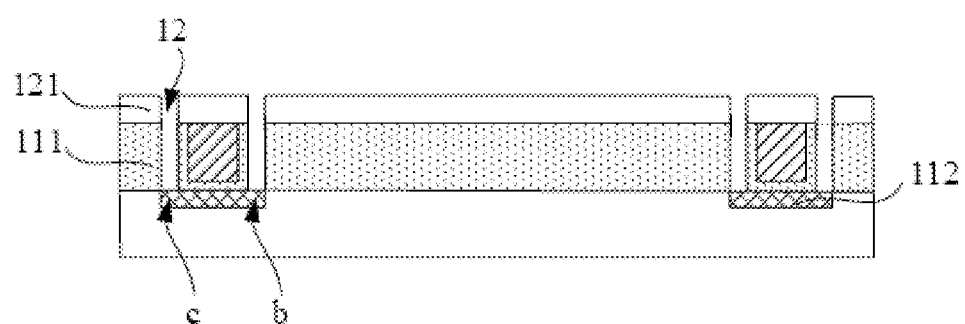
FIG. 11 is a schematic structural sectional diagram corresponding to various steps of the manufacturing method of the semiconductor structure according to the second embodiment of the present disclosure.

Referring to FIG. 10 and FIG. 11, FIG. 11 is a schematic structural stepped sectional diagram of FIG. 10 along a CC1 direction. The first medium layer 111 and the second medium layer 121 are etched to form through holes 12 that are located on the two opposite sides of the magnetic core 103 and exposed out of the first end b or the second end c.

Figure 14:
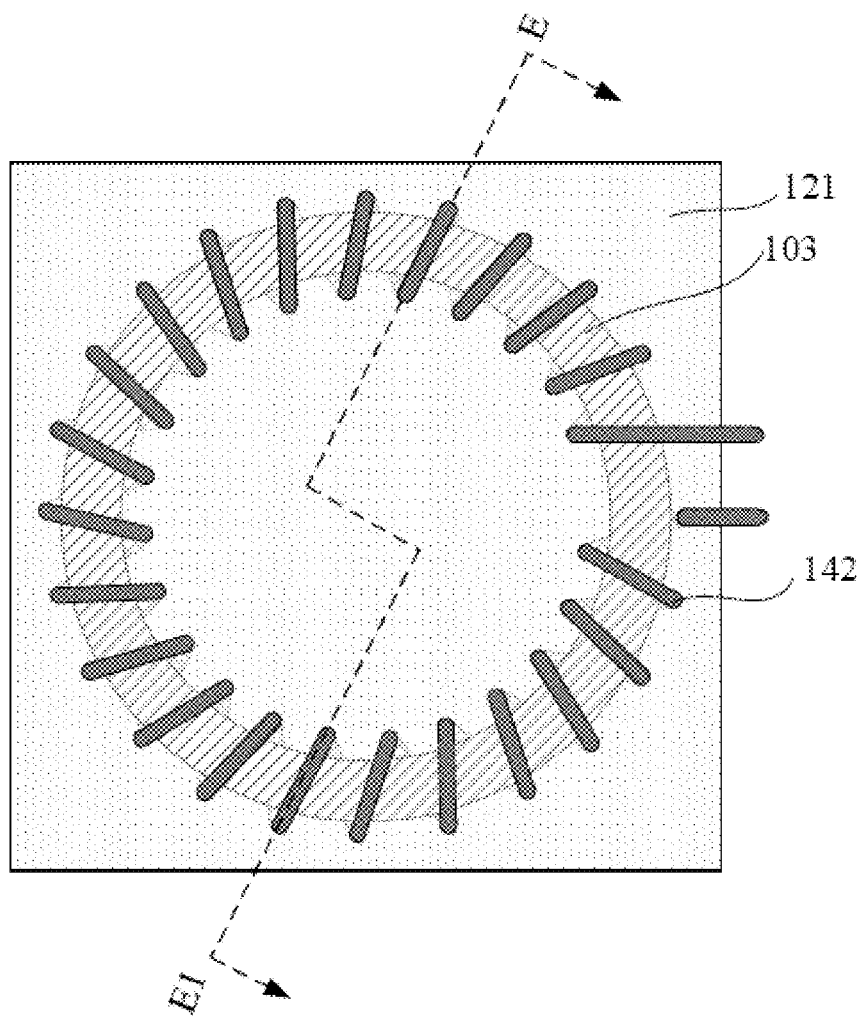
FIG. 14 is a schematic structural top-view diagram corresponding to various steps of the manufacturing method of the semiconductor structure according to the second embodiment of the present disclosure.
Figure 15:
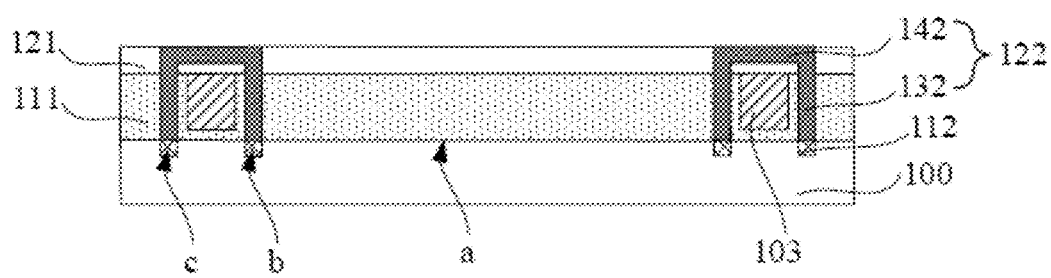
FIG. 15 is a schematic structural sectional diagram corresponding to various steps of the manufacturing method of the semiconductor structure according to the second embodiment of the present disclosure.

In an example, referring to FIG. 14 and FIG. 15, FIG. 15 is a schematic structural stepped sectional diagram of FIG. 14 along an EE1 direction. A plurality of second metal layers 122 are formed that fill up the through holes 12 (see FIG. 11) and are also located on a side of the magnetic core 103 away from the substrate 100. One end of the second metal layer 122 is electrically connected with the first end b of one of the first metal layers 112, the other end of the second metal layer 122 is electrically connected with the second end c of another one of the first metal layers 112, the plurality of first metal layers 112 and the plurality of second metal layers 122 constitute a solenoid-shaped metal layer 102, and the metal layer 102 and the magnetic core 103 has a gap therebetween.

In particular, in this embodiment, the medium layer 101 (see FIG. 2) further includes a second medium layer 121 located on a side of the first medium layer 111 away from the substrate 100. The process step of forming the plurality of second metal layers 122 includes the followings.

With continued reference to FIG. 10 and FIG. 11, the first medium layer 111 and the second medium layer 121 are etched to form through holes 12. In this embodiment, a filling layer is formed in the through hole 12, and in the subsequent process step of re-etching the second medium layer 121, the second medium layer 121 and the filling layer collectively constitute a relatively planar surface when a photoresist is coated on the second medium layer 121. As a result, uniform coating of the photoresist can be accomplished and the phenomenon of defocusing during the following photoetching can be avoided. In addition, the material of the filling layer is an organic compound.

Figure 12:
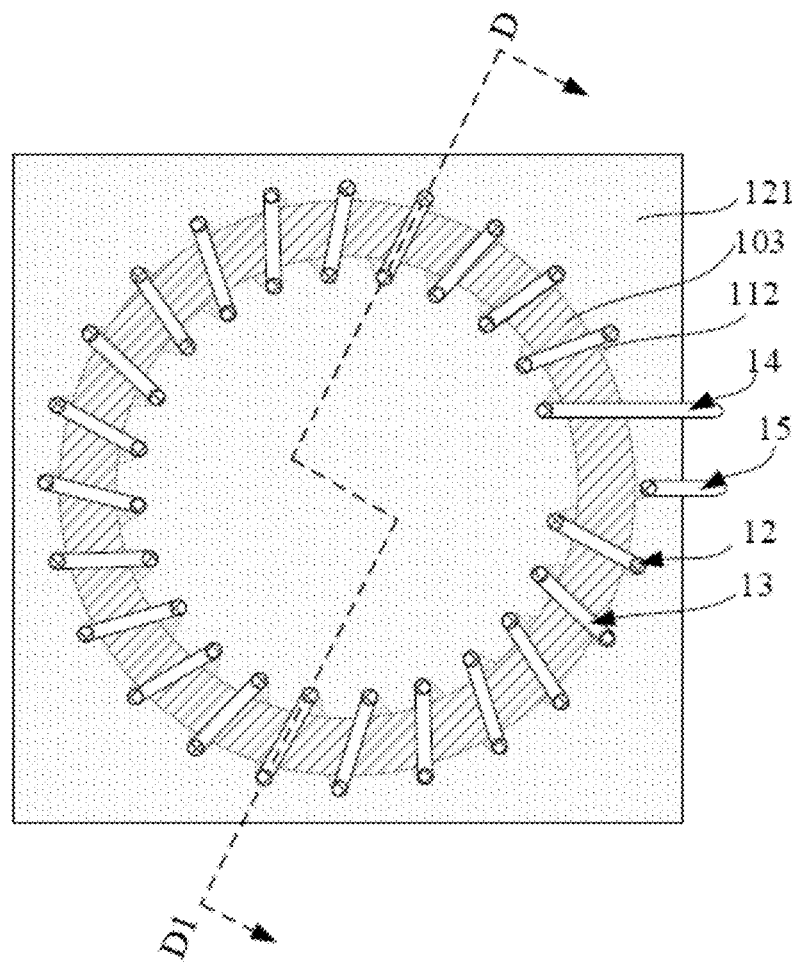
FIG. 12 is a schematic structural top-view diagram corresponding to various steps of the manufacturing method of the semiconductor structure according to the second embodiment of the present disclosure.
Figure 13:
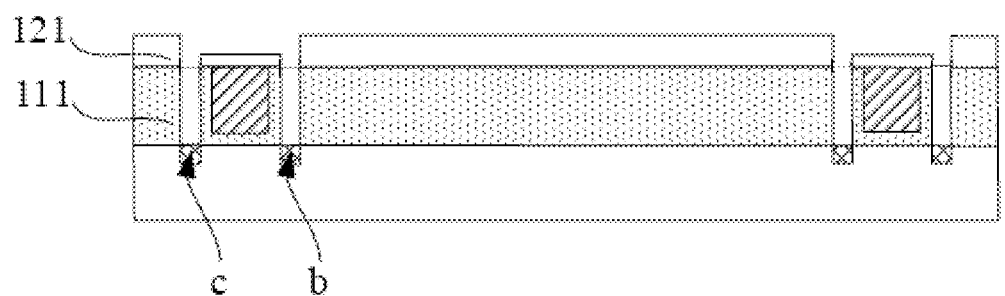
FIG. 13 is a schematic structural sectional diagram corresponding to various steps of the manufacturing method of the semiconductor structure according to the second embodiment of the present disclosure.

Referring to FIG. 12 and FIG. 13, FIG. 13 is a schematic structural stepped sectional diagram of FIG. 12 along a DD1 direction. The second medium layer 121 is etched to form a plurality of second grooves 13, one end of the second groove 13 is communicated with the through hole 12 exposed out of the first end b of one first metal layer 112, and the other end of the second groove 13 is communicated with the through hole 12 exposed out of the second end c of another first metal layer 112.

In particular, the process step of forming the plurality of second grooves includes the follows.

A first mask layer having a first mask pattern is formed on the second medium layer 121 on the basis that the filling layer is formed in the through hole 12. In this embodiment, the first mask layer is a photoresist that is illuminated and treated with a developer.

Then, with the first mask layer as a mask, the second medium layer 121 is etched to form a plurality of second grooves 13; and the first mask layer and the filling layer are removed. In this embodiment, the first mask layer and the filling layer can be removed using an etching process or an ashing process. In particular, oxygen is introduced into a chamber and the parameters of the chamber are adjusted, such that the first mask layer and the filling layer react with the oxygen to produce a gas and therefore the first mask layer and the filling layer are removed.

In this embodiment, in the process step of etching the second medium layer 121 to form a plurality of second grooves 13 while the first mask layer serves as the mask, a third groove 14 and a fourth groove 15 are also formed. The third groove 14 is communicated with one second groove 13 and the fourth groove 15 is communicated with one through hole 12. In an example, the fourth groove 15 is communicated with one through hole 12 adjacent to the third groove 14. In the subsequent process step of forming the second metal layers in the through holes 12 and the second grooves 13, a first lead is also formed in the third groove and a second lead is also formed in the fourth groove. Since the first lead, the second lead and the second metal layers are formed simultaneously, the first lead, the second lead and the second metal layers are structurally integrally formed, which can avoid generating a contact resistance between the first and second leads and the second metal layers, and thus facilitates improving the conductivity between the first and second leads and the second metal layers. In other embodiments, when the substrate is etched to form the first grooves, at least one of the third groove and the fourth groove may also be formed; alternatively, subsequent to formation of both the first metal layer and the second metal layer, the third groove and the fourth groove are formed.

With continued reference to FIG. 14 and FIG. 15, the second metal layers 122 are formed in the through holes 12 (see FIG. 12) and the second grooves 13 (see FIG. 12).

In particular, the semiconductor structure is immersed in a second solution and electroplated there, to form a second basic metal layer in the through holes 12, in the second grooves 13 and on the surface of the second medium layer 121. In particular, prior to formation of the second basic metal layer, a second electroplating seed layer is deposited on the surfaces of the through holes 12, on the surfaces of the second grooves 13 and on the surface of the second medium layer 121, so as to facilitate forming the second basic metal layer on the surfaces of the through holes 12, on the surfaces of the second grooves 13 and on the surface of the second medium layer 121 during the subsequent electroplating process for the semiconductor structure. In addition, the second electroplating seed layer is conducive to improving the contact characteristics between the subsequently formed second metal layer and the first metal layer 112, and thus it is avoided that execution of the subsequent process steps is affected since the second metal layer falls off or is displaced during these subsequent process steps. In this embodiment, the method for depositing the second electroplating seed layer is the same as the method for depositing the first electroplating seed layer, and the second solution may also be copper sulfate solution or silver sulfate solution.

Then, the second basic metal layer is planarized until the second medium layer 121 is exposed, so as to form the second metal layer 122.

In another example, referring to FIG. 16, the medium layer at least includes the first medium layer 111 located on the first face a and the second medium layer 121 located on a side of the first medium layer 111 away from the substrate 100, and the magnetic core 103 is at least located in the first medium layer 111.

The process step of forming a plurality of second metal layers 122 includes:

etching the first medium layer 111 and the second medium layer 121 to form through holes 12.

With reference to FIG. 17, third metal layers 132 are formed in the through holes 12; fourth metal layers 142 are formed on the top of the third metal layers 132 and on a part of the surface of the second medium layer 121, one end of the fourth metal layer 142 is connected with the third metal layer 132 connected with the first end b of one first metal layer 112, the other end of the fourth metal layer 142 is connected with the third metal layer 132 connected with the second end c of another first metal layer 112, and the third metal layers 132 and the fourth metal layers 142 collectively constitute the second metal layers 122.

In particular, the process step of forming the fourth metal layer 142 on the top of the third metal layer 132 and on a part of the surface of the second medium layer 121 includes: depositing a fourth basic metal layer on the surface of the third metal layer 132 and then etching the fourth basic metal layer through use of pattern-dry etching, so as to form the fourth metal layer 142. In this embodiment, the third metal layer 132 and the fourth metal layer 142 have the same material. Further, both the third metal layer 132 and the fourth metal layer 142 may be copper. In other embodiments, the materials of the third metal layer and the fourth metal layer may also be different.

In this embodiment, the third metal layer 132 and the fourth metal layer 142 are both elongated. In a direction perpendicular to an extension direction of the fourth metal layer 142, the width of the fourth metal layer 142 is a fourth width, and in the extension direction of the fourth metal layer 142, the length of the fourth metal layer 142 is a fourth length. In a direction perpendicular to an extension direction of the third metal layer 132, the width of the third metal layer 132 is a third width. The distance between two third metal layers 132 connected with the same fourth metal layer 142 is a third length. The fourth width is equal to the third width and the fourth length is equal to the third length. In other embodiments, the fourth width may be greater than the third width and the fourth length is greater than the third length, i.e., the orthographic projection of the third metal layer on the first face a falls completely into the orthographic projection of the fourth metal layer on the first face a. Then, when the fourth metal layer is formed, it can be ensured, within certain process errors, that the top faces of the third metal layers are all electrically connected with the fourth metal layer, and further that the contact area between the third metal layer and the fourth metal layer is large enough to guarantee excellent conductivity between the third metal layer and the fourth metal layer.

In another example, referring to FIG. 18 and FIG. 19, the medium layer at least includes the first medium layer 111 located on the first face a and the second medium layer 121 located on a side of the first medium layer 111 away from the substrate 100, and the magnetic core 103 is at least located in the first medium layer 111.

The process step of forming a plurality of second metal layers 122 includes the followings.

Referring to FIG. 18, the first medium layer 111 and the second medium layer 121 are etched to form through holes;

a fifth metal layer 172 is formed that covers the second medium layer 121 and completely fills the through holes. In particular, the methods for forming the fifth metal layer 172 include an electroplating process or a deposition process.

A part of the fifth metal layer 172 is etched to expose at least a part of the surface of the second medium layer 121, so as to form the second metal layers 122. Thus, in this embodiment, the second metal layers 122 have an integrally-formed structure, which is conducive to improving the conductivity of the second metal layers 122 themselves.

In this embodiment, with continued reference to FIG. 2, the third medium layer 131 is formed on the surface of the second metal layer 122. In this embodiment, the first medium layer 111, the second medium layer 121 and the third medium layer 131 may have the same material. Further, the first medium layer 111, the second medium layer 121 and the third medium layer 131 may be silicon oxide and then, the first medium layer 111, the second medium layer 121 and the third medium layer 131 may be formed using the same chamber, thereby facilitating a reduction in the preparation cost of the semiconductor structure.

According to the second embodiment of the present disclosure, by using the common semiconductor manufacturing process, the first metal layers 112 and the second metal layers 122 are formed in the substrate 100 and the medium layer 101, the magnetic core 103 is formed in the substrate 100, the first metal layers 112 and the second metal layers 122 collectively constitute the solenoid-shaped metal layer 102 wound around the magnetic core 103. Under the effect of the magnetic core 103, the permeability of the solenoid inductor is increased and thus both the inductance and the electrical performances of the solenoid inductor can be improved. In addition, the method for forming the semiconductor structure according to the embodiments of the present disclosure has a high compatibility with the semiconductor manufacturing process.

The ordinary skills in the art can understand that the implementations described above are particular embodiments for implementing the present disclosure. In practical uses, various changes in forms and details may be made to the implementations without departing from the spirit and scope of the present disclosure. Any skills in the art may make their own changes and modifications without departing from the spirit and scope of the present disclosure. Therefore, the protection scope of the present disclosure shall be subject to the scope as defined in the claims.

What is claimed is:

1. A semiconductor structure, comprising:
   a substrate and a medium layer located on a first face of the substrate, the substrate having a plurality of first metal layers therein, the medium layer having a magnetic core therein, an orthographic projection of the magnetic core on the first face having a closed ring pattern, an orthographic projection of each of the first metal layers on the first face intersecting with the orthographic projection of the magnetic core on the first face, the first metal layer having a first end and a second end opposite to each other, an orthographic projection of the first end on the first face being located within a region surrounded by the closed ring pattern, and an orthographic projection of the second end on the first face being located outside of the region surrounded by the closed ring pattern; and
   a plurality of second metal layers, the second metal layers being located in the medium layer, the second metal layers being located on a side of the magnetic core away from the substrate and also on the two opposite sides of the magnetic core, one end of the second metal layer being electrically connected with the first end of one of the first metal layers, the other end of the second metal layer being electrically connected with the second end of another one of the first metal layers, the plurality of first metal layers and the plurality of second metal layers constituting a solenoid-shaped metal layer, and the metal layer and the magnetic core having a gap therebetween.

2. The semiconductor structure according to claim 1, wherein the second metal layer comprises third metal layers located on the two opposite sides of the magnetic core and a fourth metal layer located on a side of the magnetic core away from the substrate, and the third metal layer penetrates through a part of the medium layer and is electrically connected with the first metal layer.

3. The semiconductor structure according to claim 2, wherein in a direction perpendicular to the first face, a range of a thickness of the fourth metal layer is the same as the range of the thickness of the first metal layer; and the range of the thickness of the third metal layer in a direction perpendicular to an extension direction of the third metal layer is the same as the range of the thickness of the first metal layer.

4. The semiconductor structure according to claim 2, wherein the range of a spacing between the third metal layer and the magnetic core is the same as the range of the spacing between the first metal layer and the magnetic core, and the range of the spacing between the fourth metal layer and the magnetic core is the same as the range of the spacing between the first metal layer and the magnetic core.

5. The semiconductor structure according to claim 2, wherein the medium layer at least comprises a first medium layer located on the first face and a second medium layer located on a side of the first medium layer away from the substrate, the magnetic core is located in the first medium layer, the third metal layer penetrates through the first medium layer and the second medium layer, and the fourth metal layer is located in the second medium layer.

6. The semiconductor structure according to claim 5, wherein the medium layer further comprises a third medium layer located on a side of the second medium layer away from the substrate, and the third medium layer is located on the surface of the fourth metal layer.

7. A manufacturing method of the semiconductor structure, comprising:
   providing a substrate, the substrate having a plurality of first metal layers therein;
   forming a medium layer on a first face of the substrate, the medium layer having a magnetic core therein, an orthographic projection of the magnetic core on the first face having a closed ring pattern, an orthographic projection of each of the first metal layers on the first face intersecting with the orthographic projection of the magnetic core on the first face, the first metal layer having a first end and a second end opposite to each other, an orthographic projection of the first end on the first face being located within a region surrounded by the closed ring pattern, and an orthographic projection of the second end on the first face being located outside of the region surrounded by the closed ring pattern;
   etching the medium layer to form through holes, the through holes being located on the two opposite sides of the magnetic core and being exposed out of the first end or the second end; and
   forming a plurality of second metal layers, the second metal layers filling up the through holes and also being located on a side of the magnetic core away from the substrate, one end of the second metal layer being electrically connected with the first end of one of the first metal layers, the other end of the second metal layer being electrically connected with the second end of another one of the first metal layers, the plurality of first metal layers and the plurality of second metal layers constituting a solenoid-shaped metal layer, and the metal layer and the magnetic core having a gap therebetween.

8. The manufacturing method of the semiconductor structure according to claim 7, wherein said forming the plurality of first metal layers comprises:
etching the substrate to form a plurality of first grooves;
immersing, in a first solution, and electroplating the substrate, to form a first basic metal layer in the first grooves and on the first face; and
planarizing the first basic metal layer until the first face is exposed, so as to form the first metal layer.

9. The manufacturing method of the semiconductor structure according to claim 7, wherein the medium layer comprises a first medium layer located on the first face; and said forming the magnetic core comprises:
etching the first medium layer to form a trench, an orthographic projection of the trench on the first face having a closed ring pattern;
forming a metal material layer that covers the first medium layer and completely fills the trench; and
planarizing the metal material layer until the surface of the first medium layer is exposed.

10. The manufacturing method of the semiconductor structure according to claim 9, wherein the medium layer further comprises a second medium layer located on a side of the first medium layer away from the substrate; and said forming the plurality of second metal layers comprises:
etching the first medium layer and the second medium layer to form through holes;
etching the second medium layer to form a plurality of second grooves, one end of the second groove being communicated with the through hole exposed out of the first end of one of the first metal layers, and the other end of the second groove being communicated with the through hole exposed out of the second end of another one of the first metal layers; and
forming the second metal layers in the through holes and the second grooves.

11. The manufacturing method of the semiconductor structure according to claim 10, wherein the method, before etching the second medium layer to form the plurality of second grooves, further comprises: forming a filling layer in the through hole; and said forming the plurality of second grooves comprises:
forming, on the second medium layer, a first mask layer having a first mask pattern;
etching, with the first mask layer as a mask, the second medium layer to form the plurality of second grooves; and
removing the first mask layer and the filling layer.

12. The manufacturing method of the semiconductor structure according to claim 11, wherein said forming the second metal layers in the through holes and the second grooves comprises:
immersing, in a second solution, and electroplating the semiconductor structure, to form a second basic metal layer in the through holes, in the second grooves and on the surface of the second medium layer; and
planarizing the second basic metal layer until the surface of the second medium layer is exposed, so as to form the second metal layers.

13. The manufacturing method of the semiconductor structure according to claim 7, wherein the medium layer at least comprises a first medium layer located on the first face and a second medium layer located on a side of the first medium layer away from the substrate, the magnetic core is at least located in the first medium layer; the process step of forming the plurality of second metal layers comprises:
etching the first medium layer and the second medium layer to form the through holes;
forming third metal layers in the through holes; and
forming fourth metal layers on the surfaces of the third metal layers, one end of the fourth metal layer being connected with the third metal layer connected with the first end of one of the first metal layers, the other end of the fourth metal layer being connected with the third metal layer connected with the second end of another one of the first metal layers, and the third metal layers and the fourth metal layers collectively constituting the second metal layers.

14. The manufacturing method of the semiconductor structure according to claim 7, wherein the medium layer at least comprises a first medium layer located on the first face and a second medium layer located on a side of the first medium layer away from the substrate, the magnetic core is at least located in the first medium layer; and said forming the plurality of second metal layers comprises:
etching the first medium layer and the second medium layer to form the through holes;
forming a fifth metal layer that covers the second medium layer and completely fills the through holes; and
etching a part of the fifth metal layer to expose at least a part of the surface of the second medium layer, so as to form the second metal layers.

15. The manufacturing method of the semiconductor structure according to claim 10, wherein a third medium layer is formed on the surface of the second metal layer.

16. The manufacturing method of the semiconductor structure according to claim 13, wherein a third medium layer is formed on the surface of the second metal layer.

17. The manufacturing method of the semiconductor structure according to claim 14, wherein a third medium layer is formed on the surface of the second metal layer.

* * * * *